(12) United States Patent
Yeh et al.

(10) Patent No.: US 12,297,103 B2
(45) Date of Patent: May 13, 2025

(54) DEVICE FOR PROTECTING FEOL ELEMENT AND BEOL ELEMENT

(71) Applicant: TAIWAN SEMICONDUCTOR MANUFACTURING CO., LTD., Hsinchu (TW)

(72) Inventors: Ping-Chun Yeh, Taichung (TW); Lien-Yao Tsai, Hsinchu (TW); Shao-Chi Yu, Hsinchu (TW)

(73) Assignee: TAIWAN SEMICONDUCTOR MANUFACTURING CO., LTD., Hsinchu (TW)

(\*) Notice: Subject to any disclaimer, the term of this patent is extended or adjusted under 35 U.S.C. 154(b) by 170 days.

(21) Appl. No.: 17/827,533

(22) Filed: May 27, 2022

(65) Prior Publication Data

US 2022/0289564 A1 Sep. 15, 2022

Related U.S. Application Data

(60) Continuation of application No. 16/715,884, filed on Dec. 16, 2019, now Pat. No. 11,345,591, which is a division of application No. 16/209,471, filed on Dec. 4, 2018, now Pat. No. 10,508,028, which is a division of application No. 14/607,581, filed on Jan. 28, 2015, now Pat. No. 10,155,660.

(51) Int. Cl.
*H01L 29/78* (2006.01)
*B81C 1/00* (2006.01)

(52) U.S. Cl.
CPC ...... *B81C 1/00246* (2013.01); *B81C 1/00833* (2013.01); *B81B 2207/015* (2013.01); *B81B 2207/07* (2013.01); *B81C 2203/0118* (2013.01); *B81C 2203/0735* (2013.01)

(58) Field of Classification Search
CPC ........ B81C 1/00246; B81C 2203/0735; B81C 2203/0118; B81B 2207/015; B81B 2207/07; H01L 29/78633; H01L 27/3272
See application file for complete search history.

(56) References Cited

U.S. PATENT DOCUMENTS

| | | | |
|---|---|---|---|
| 8,563,403 B1 | 10/2013 | Farooq et al. | |
| 10,155,660 B2 | 12/2018 | Tsai et al. | |
| 2008/0277778 A1 | 11/2008 | Furman et al. | |
| 2009/0189725 A1 | 7/2009 | Ding et al. | |
| 2009/0305499 A1 | 12/2009 | Gambino | |
| 2010/0159688 A1 | 6/2010 | Rinerson et al. | |
| 2012/0193752 A1 | 8/2012 | Purushothaman et al. | |
| 2012/0280393 A1 | 11/2012 | Kaynak et al. | |
| 2013/0285122 A1\* | 10/2013 | Yamazaki | B81B 3/0086 257/254 |

(Continued)

*Primary Examiner* — Vu A Vu
*Assistant Examiner* — Valerie N Newton
(74) *Attorney, Agent, or Firm* — Maschoff Brennan

(57) ABSTRACT

A method includes forming a front-end-of-the-line (FEOL) element over a substrate; forming a back-end-of-the-line (BEOL) element over the FEOL element; forming an interconnection structure over the substrate; forming a conductive shielding layer electrically connected to the interconnection structure and vertically overlapping the FEOL element and the BEOL element, wherein the conductive shielding layer is grounded to the substrate through the interconnection structure; and forming a dielectric layer covering the conductive shielding layer.

20 Claims, 10 Drawing Sheets

(56) References Cited

U.S. PATENT DOCUMENTS

2014/0070335 A1\* 3/2014 Yamazaki ............... H01L 29/84
                                                                257/415
2014/0070426 A1   3/2014 Park et al.
2014/0110799 A1\* 4/2014 Yoshizawa ................ B81B 7/02
                                                                257/415

\* cited by examiner

DEVICE FOR PROTECTING FEOL ELEMENT AND BEOL ELEMENT

PRIORITY CLAIM AND CROSS-REFERENCE

This is a continuation application of U.S. patent application Ser. No. 16/715,884 filed on Dec. 16, 2019, now U.S. Pat. No. 11,345,591 issued on May 31, 2022, which is incorporated herein by reference in its entirety. U.S. patent application Ser. No. 16/715,884 is a divisional application of U.S. patent application Ser. No. 16/209,471 filed on Dec. 4, 2018, now U.S. Pat. No. 10,508,028 issued on Dec. 17, 2019, which is incorporated herein by reference in its entirety. U.S. patent application Ser. No. 16/209,471 is a divisional application of U.S. patent application Ser. No. 14/607,581 filed on Jan. 28, 2015, U.S. Pat. No. 10,155,660 issued on Dec. 18, 2018, which is incorporated herein by reference in its entirety.

BACKGROUND

The present disclosure generally relates to semiconductor devices, and specifically relates to a device and method for protecting front-end-of-the-line (FEOL) elements and back-end-of-the-line (BEOL) elements.

FEOL elements are individual elements, e.g., transistors, diodes, resistors, which formed on the first portion of integrated circuit (IC) fabrication. BEOL elements are wiring elements which formed on the second portion of IC fabrication where the individual elements get interconnected with wiring on the IC wafer. More specifically, after the last FEOL process, there is a wafer with isolated elements (without any wires). In BEOL processes, contact pads, interconnect wires, vias and dielectric structures are formed to connect those isolated elements.

Complementary metal-oxide-semiconductor (CMOS) technology is the predominant fabrication technology for integrated circuit (IC). As technology advances, micro electromechanical system (MEMS) can be attached to a CMOS wafer to form a CMOS-MEMS device. Merely by way of example, the CMOS-MEMS device may include an accelerometer, a pressure sensor, an angular sensor, a microphone and others, and these micro devices include many advantages, such as low power consumption, short response time, and low drive voltage. However, while the size of the CMOS-MEMS device decreases, the FEOL elements and BEOL elements are apt to suffer from process damage, causing low yield in fabricating the CMOS-MEMS device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 through FIG. 8 are cross-sectional views of intermediate stages in the manufacturing of a package including a CMOS-MEMS device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, operations, operations, elements, and/or components, but do not preclude the presence or addition of one or more other features, regions, integers, operations, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

A Complementary metal-oxide-semiconductor (CMOS)-micro electromechanical system (MEMS) device and method of forming the same are provided in accordance with various embodiments. The intermediate stages of forming the CMOS-MEMS device are illustrated. The variations of the embodiments are discussed. Throughout the various views and illustrative embodiments, like reference numbers are used to designate like elements.

FIG. 1 through FIG. 8 are cross-sectional views of intermediate stages in the manufacturing of a package including a CMOS-MEMS device in accordance with a first embodiment of the present disclosure. In FIG. 1, a semiconductor substrate 100 is provided. The semiconductor substrate 100 may be a silicon substrate or a semiconductor substrate formed of other semiconductor materials. In some embodiments, the semiconductor substrate 100 is lightly doped with a p-type impurity, but the present disclosure is not limited thereto.

As shown in FIG. 1, a plurality of front-end-of-the-line (FEOL) elements 102 are formed on the surface 100a of the semiconductor substrate 100. In some embodiments, the FEOL elements 102 may include transistors, resistors, diodes, CMOS devices, etc, but the present disclosure is not limited thereto.

Figure 2:
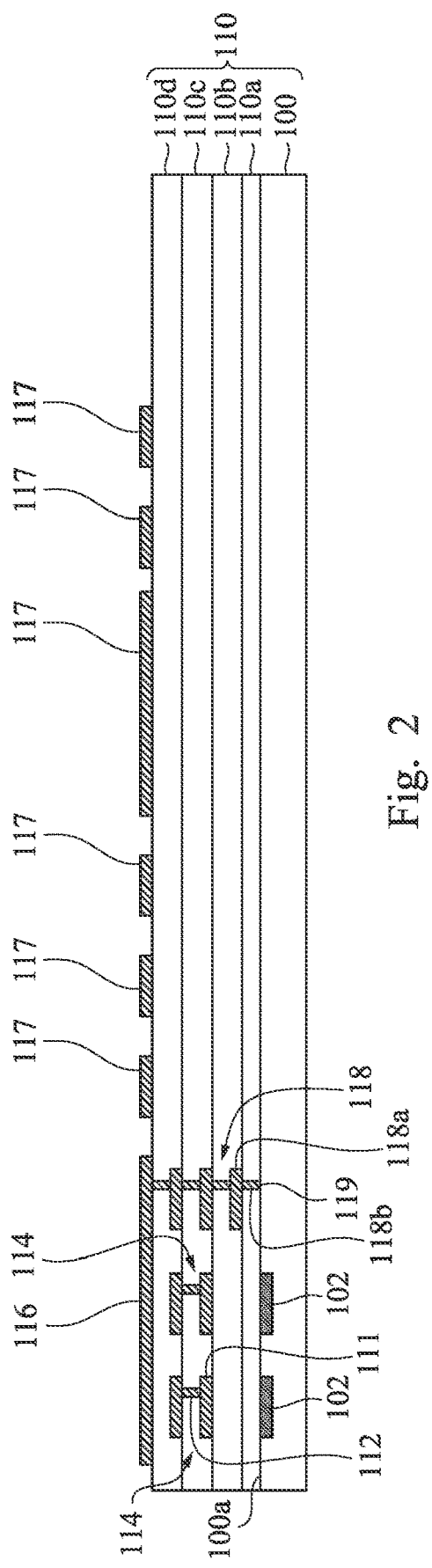

In FIG. 2, a plurality of dielectric layers 110a, 110b, 110c and 110d are formed on the semiconductor substrate 100 in sequence. Furthermore, metal lines 111, and vias 112 are formed in the dielectric layers 110a, 110b, 110c and 110d. The back-end-of-the-line (BEOL) elements 114 include the metal lines 111 and the vias 112 disposed in the dielectric layers 110a, 110b, 110c and 110d. In various embodiments, the BEOL elements 114 include capacitors, such as metal-insulator-metal (MIM) capacitors or metal-oxide-metal (MOM) capacitors, etc, but the present disclosure is not limited thereto. Furthermore, after forming the BEOL elements 114, the formation of a CMOS wafer 110 that includes the FEOL elements 102 and the BEOL elements 114 is approximately finished. The BEOL elements 114 and the FEOL elements 102 are able to communicate with some other devices, such as a micro electromechanical system (MEMS) device, and to transmit or receive signals from the MEMS device.

With reference made to FIG. 2, a first interconnect structure 118 is formed through the dielectric layers 110a, 110b, 110c and 110d. The first interconnect structure 118 includes a plurality of metal lines 118a and vias 118b. For example, in FIG. 2, after forming the dielectric layer 110a on the semiconductor substrate 100, an opening is formed in the dielectric layer 110a by, for example, lithography and etching. Thereafter, a conductive material is filled in the opening by, for example, a deposition process. Through filling the conductive material in the opening, the via 118b in the dielectric layer 110a is formed. Then, the metal line 118a is formed on the dielectric layer 110a and the via 118b. Similarly, the dielectric layer 110b is formed on the dielectric layer 110a, and an opening is formed in the dielectric layer 110b to expose at least a part of the metal line 118a formed on the dielectric layer 110a. Thereafter, a conductive material is filled in the opening of the second dielectric layer 110b to form the via 118b in the dielectric layer 110b. The rest can be done in the same manner. As a result, the resultant first interconnect structure 118 shown in FIG. 2 is formed.

In various embodiments, the dielectric layers 110a, 110b, 110c and 110d can be made of any organic or inorganic dielectric material. The dielectric layers 110a, 110b, 110c and 110d can be formed by, for example, chemical vapor deposition (CVD), plasma-enhanced chemical vapor deposition (PECVD), chemical solution deposition, spin-on coating, evaporation, and the like. In some embodiments, the metal lines 111 and the vias 112 of the BEOL elements 114, and the metal lines 118a and the vias 118b of the first interconnect structure 118 can be made of a conductive material, such as Cu, Al, Ta, TaN, W or alloys and silicides thereof. The metal lines 111 and the vias 112 of the BEOL elements 114, and the metal lines 118a and the vias 118b of the first interconnect structure 118 can be formed by a deposition process, such as sputtering, plating, CVD, PECVD, evaporation, and the like.

With reference made to FIG. 2, a conductive shielding layer 116 is formed on the dielectric layer 110d. Furthermore, the conductive shielding layer 116 is electrically connected to a ground contact 119. The ground contact 119 is a contact portion on the surface 100a of the semiconductor substrate 100 and in contact with the first interconnect structure 118, and the conductive shielding layer 116 is electrically connected to the semiconductor substrate 100 through the first interconnect structure 118 and the ground contact 119. In various embodiments, the ground contact 119 is grounded.

With reference made to FIG. 2, the conductive shielding layer 116 at least covers the FEOL elements 102 and the BEOL elements 114, so as to protect the FEOL elements 102 and the BEOL elements 114 from some process damages. More specifically, during the etching, grinding or chemical-mechanical planarization (CMP) process, charges (such as electrons) may be accumulated on the conductive shielding layer 116 if the conductive shielding layer 116 is not electrically connected to the ground contact 119. The accumulated charges may cause damage to the FEOL elements 102 and the BEOL elements 114. For example, the accumulated charges may result in electromigration (EM) damage to the FEOL elements 102 and the BEOL elements 114, causing unexpected shorts or opens to the FEOL elements 102 or the BEOL elements 114.

More specifically, the effect of electromigration damage becomes a concern as the size of the FEOL elements 102 and the BEOL elements 114 decreases. That is, as the structure size in the FEOL elements 102 and the BEOL elements 114 decreases, the risk of occurrence of the electromigration damage increases. For example, when the electromigration damage happens on the BEOL elements 114, the shape of the metal lines 111 and/or the vias 112 of the BEOL elements 114 may be deformed, thereby causing unexpected shorts or opens to the BEOL elements 114. Therefore, in various embodiments, the conductive shielding layer 116 at least covers the FEOL elements 102 and the BEOL elements 114. That is, an orthogonal projection of the conductive shielding layer 116 on the semiconductor substrate 100 overlaps with an orthogonal projection of the FEOL elements 102 on the semiconductor substrate 100, and the orthogonal projection of the conductive shielding layer 116 on the semiconductor substrate 100 overlaps with an orthogonal projection of the BEOL elements 114 on the semiconductor substrate 100. As a result, by electrically connecting the conductive shielding layer 116 to the semiconductor substrate 100 through the ground contact 119, the conductive shielding layer 116 is grounded, and the accumulated charges, if any, are conducted to the semiconductor substrate 100. Therefore, the risk of causing unexpected shorts or opens to the FEOL elements 102 or the BEOL elements 114 is eliminated.

In various embodiments, the conductive shielding layer 116 is made of a conductive material, such as Cu, Al, Ta, TaN, W or alloys and silicides thereof. The conductive shielding layer 116 is formed on the dielectric layer 110d by a deposition process, such as CVD, PECVD, evaporation and the like.

Figure 3:
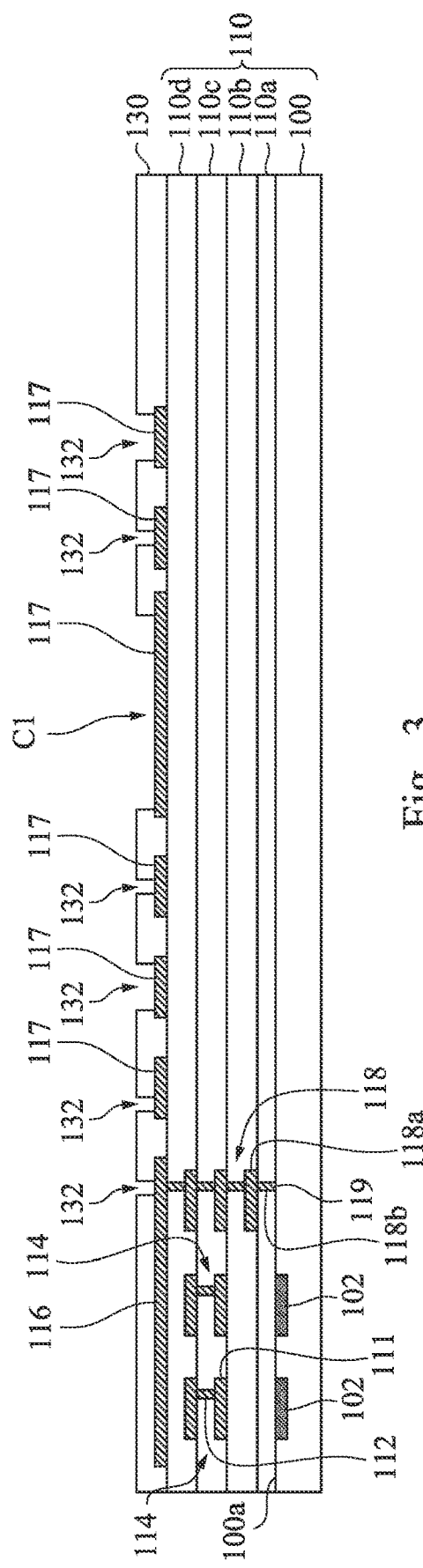

In FIG. 3, an inter-layer dielectric (ILD) layer 130 is formed on the CMOS wafer 110. More specifically, the ILD layer 130 is formed on the dielectric layer 110d to cover the conductive shielding layer 116 and other metal layers 117 formed on the dielectric layer 110d. The ILD layer 130 is patterned to form a plurality of openings 132 and a first cavity C1. The openings 132 and the first cavity C1 expose at least a part of the conductive shielding layer 116 and the metal layers 117, so that the CMOS wafer 130 can be connected to a MEMS wafer through the openings 132, the first cavity C1, and the metal layers 117.

The ILD layer 130 is made of any organic or inorganic material. The first cavity C1 and openings 132 are formed by, for example, lithography and etching. Since the conductive shielding layer 116 covers the BEOL elements 114 and the FEOL elements 102, and the conductive shielding layer 116 is electrically connected to the semiconductor substrate 100, the conductive shielding layer 116 can protect the BEOL elements 114 and the FEOL elements 102 from the process damages because of etching the ILD layer 130.

Figure 4:
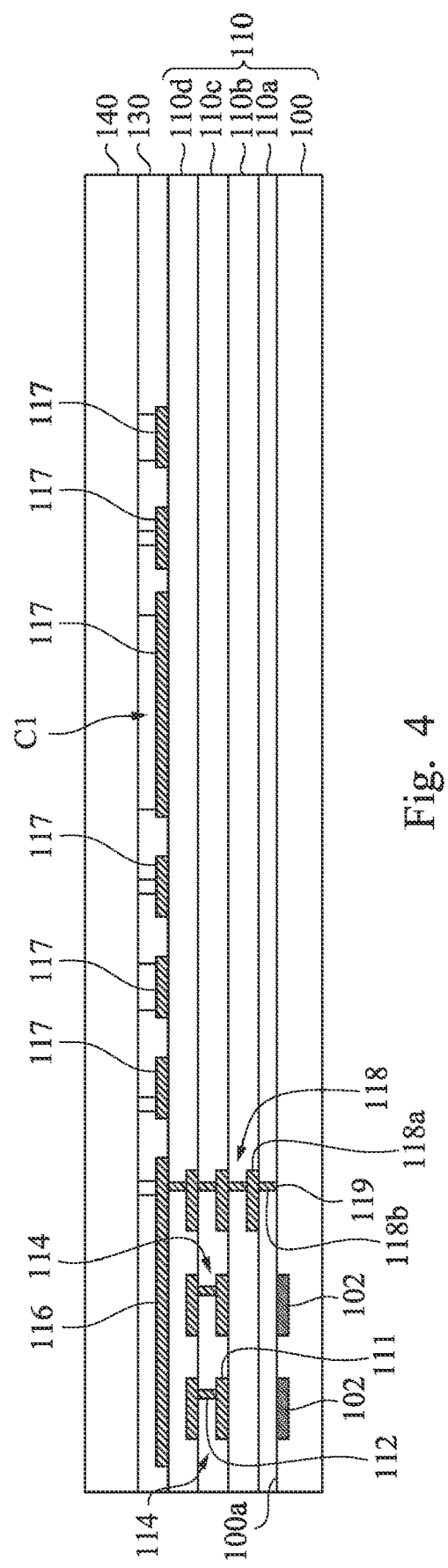

In FIG. 4, a MEMS wafer 140 is formed on the ILD layer 130. The MEMS wafer 140 may be a silicon wafer. More specifically, the MEMS wafer 140 may be free from active devices, such as transistors therein, and may be, or may not be, free from passive devices, such as resistors, capacitors, and inductors therein.

Figure 5:
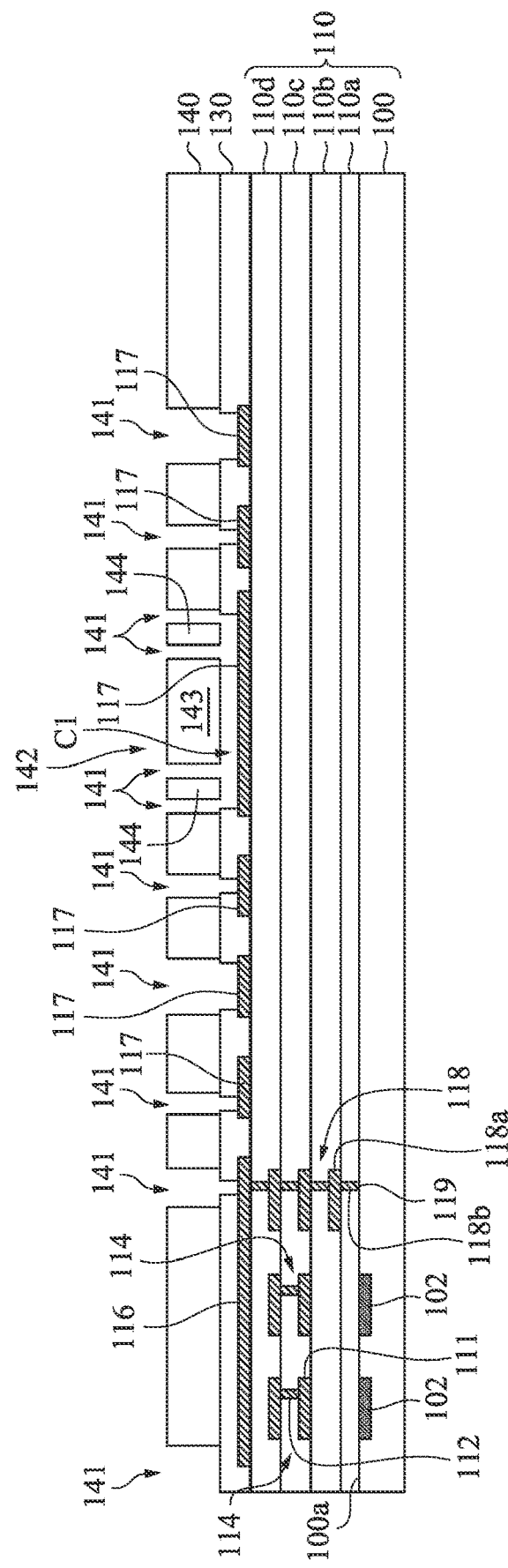

In FIG. 5, the MEMS wafer 140 is then patterned by an etching process to form openings 141 and MEMS devices 142. In the embodiment of FIG. 5, the MEMS devices 142 may include at least one movable element 143 and springs 144 for supporting the movable element 143. In some embodiments, the MEMS devices 142 may include other MEMS features. The MEMS devices 142 are aligned with the cavity C1 formed in the ILD layer 130, so that the movable element 143 of the MEMS devices 142 can move in the cavity C1.

Since the conductive shielding layer 116 covers the BEOL elements 114 and the FEOL elements 102, and the conductive shielding layer 116 is electrically connected to the semiconductor substrate 100, the conductive shielding layer 116 can protect the BEOL elements 114 and the FEOL elements 102 from the process damages because of etching the MEMS wafer 140.

Figure 6:
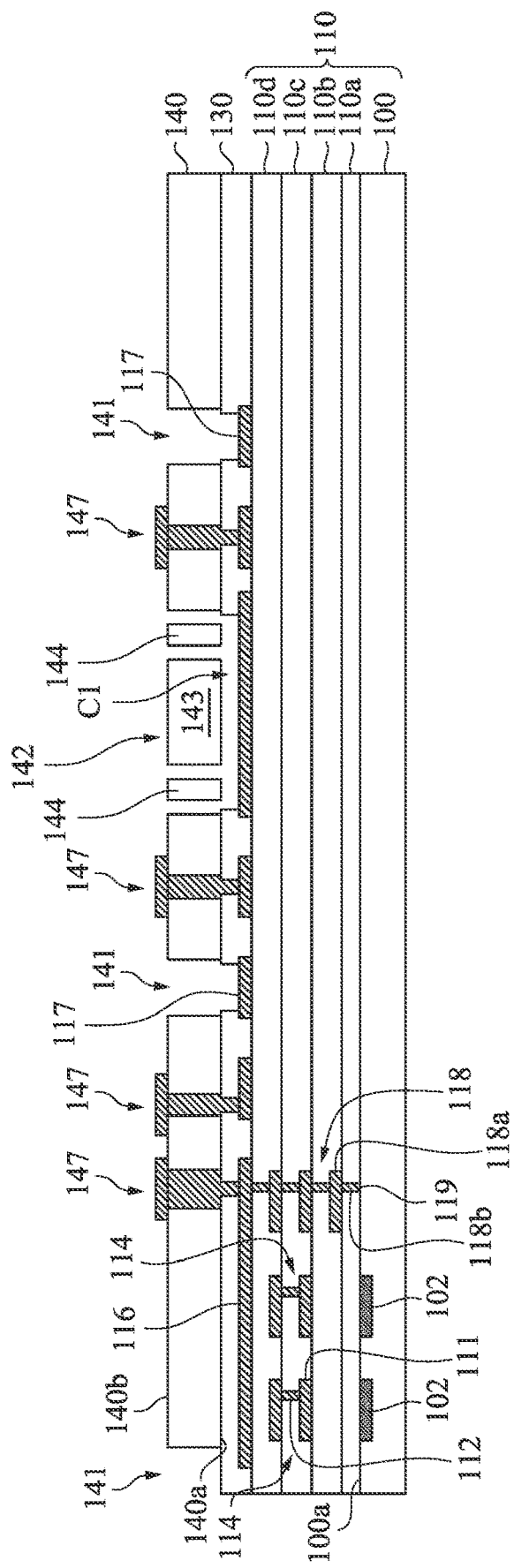

In FIG. 6, the MEMS wafer 140 is electrically connected to the CMOS wafer 110. More specifically, a conductive material is filled in some of the openings 141 by, for example, a deposition process. Through filling the conductive material in some of the openings 141, a plurality of second interconnect structures 147 are formed to electrically connect to the CMOS wafer 110. Furthermore, one of the second interconnect structures 147 is electrically connected to the conductive shielding layer 116 formed in the CMOS wafer 110. Since one of the second interconnect structures 147 is electrically connected to the conductive shielding layer 116, the charges accumulated on the surface of the MEMS wafer 140 can be conducted to the semiconductor substrate 100 as well.

More specifically, the MEMS wafer 140 may include a first surface 140a and a second surface 140b, in which the first surface 140a of the MEMS wafer 140 faces the CMOS wafer 110. The second interconnect structures 147 of the MEMS wafer 140 extend across the first surface 140a and the second surface 140b. While other MEMS processes are performed on the MEMS wafer 140, the second surface 140b of the MEMS wafer 140 are more apt to receive or accumulate charges. Since one of the second interconnect structures 147 electrically connects the second surface 140b to the conductive shielding layer 116, the charges accumulated or received from the second surface 140b can be conducted to the semiconductor substrate 100 through the one of the second interconnect structures 147, the conductive shielding layer 116 and the first interconnect structure 118.

With reference made to FIG. 6, at least two openings 141 remain and expose the metal layers 117 formed in the CMOS wafer 110. However, it should be understood that the number of the remaining openings 141 is not limited to two. In various embodiments, the number of the remaining openings 141 can be adjusted according to the actual requirements.

Figure 7:
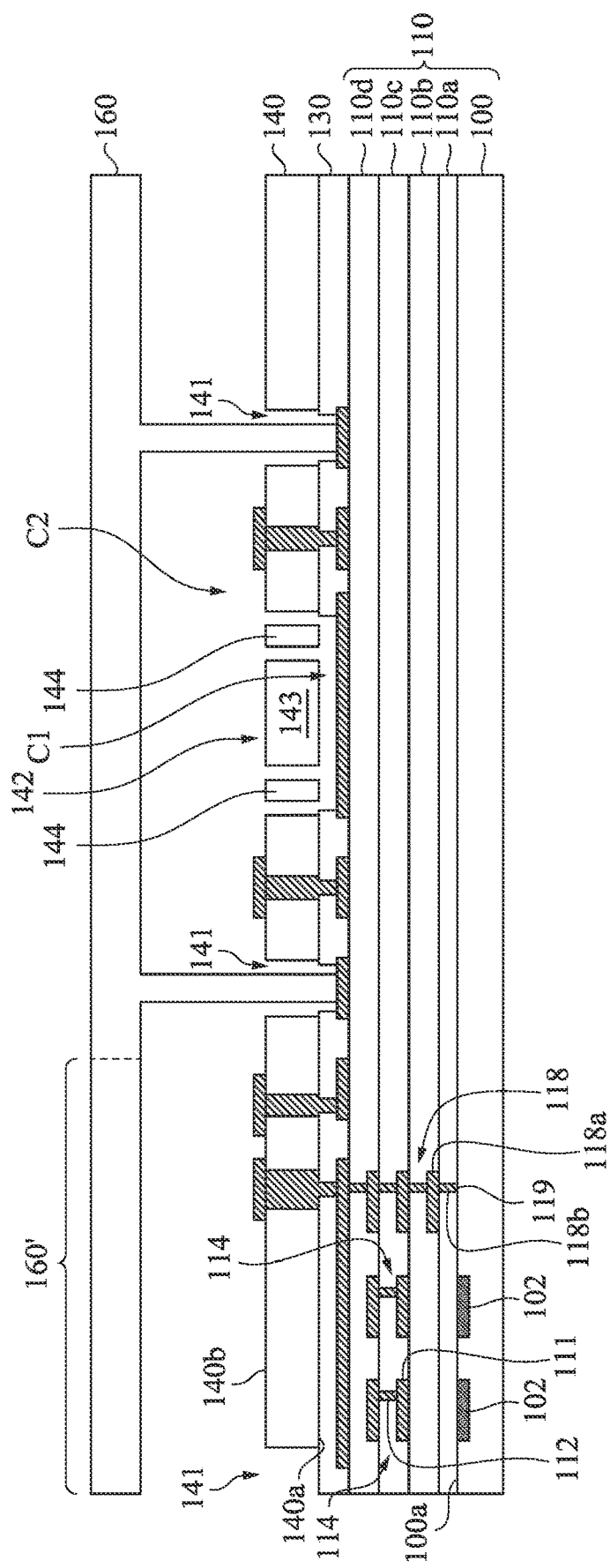

In FIG. 7, a cap wafer 160 is bonded to the CMOS wafer 110 through the two remaining openings 141. The cap wafer 160 covers the MEMS wafer 140. A second cavity C2 is formed between the cap wafer 160 and the MEMS wafer 140. More specifically, the second cavity C2 is formed on or above the MEMS devices 142 of the MEMS wafer 140. After bonding the cap wafer 160 to the CMOS wafer 110, the MEMS devices 142 is located between the first cavity C1 and the second cavity C2, so that the MEMS devices 142 can move in the first cavity C1 and/or the second cavity C2. In various embodiments, the cap wafer 160 may be a silicon wafer although other types of semiconductor wafers may also be used.

With reference made to FIG. 7, the cap wafer 160 includes at least one residue portion 160'. The residue portion 160' is a portion that will be removed, so that a portion of the MEMS wafer 140 is exposed to perform wire bonding on the exposed portion of the MEMS wafer 140.

Figure 8:
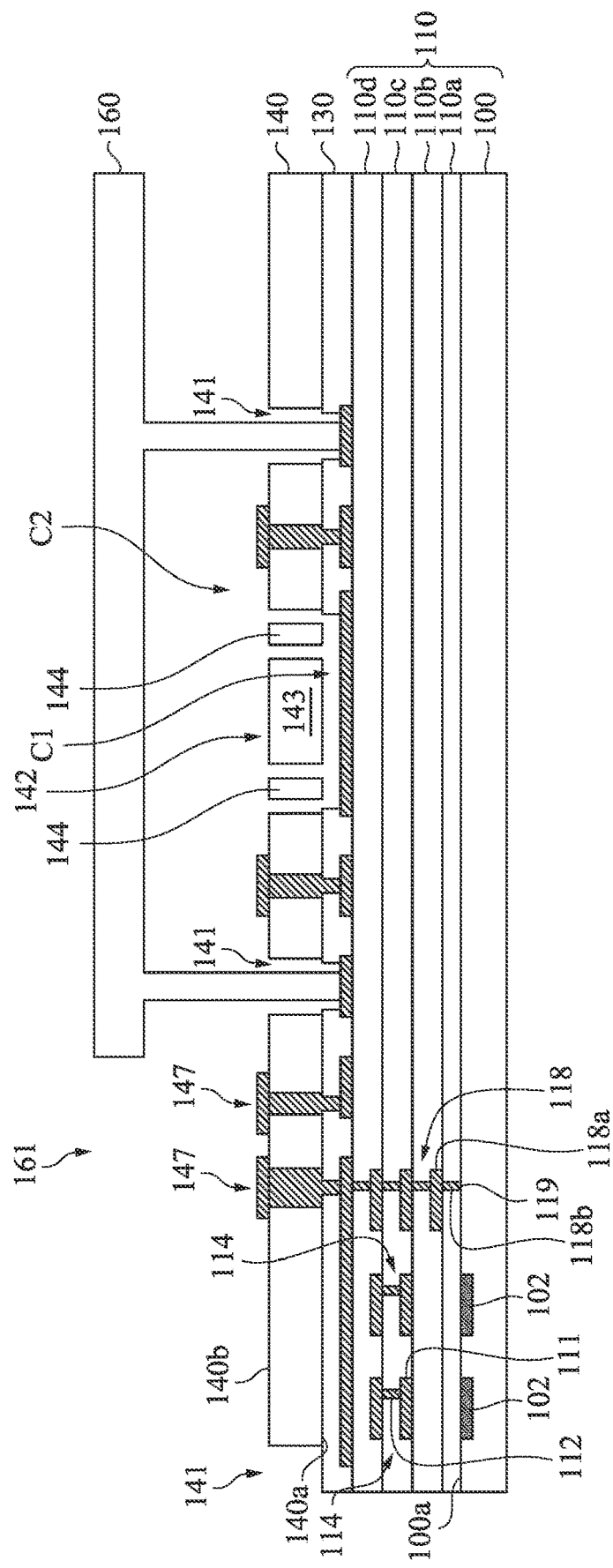

In FIG. 8, the residue portion 160' of the cap wafer 160 is removed by, for example, an etching process or a grinding process. As a result, an opening 161 is formed in the cap wafer 160 to expose a part of the MEMS wafer 140. As shown in FIG. 8, at least two second interconnect structures 147 of the MEMS wafer 140 are exposed from the opening 161 of the cap wafer 160. One of the exposed second interconnect structure 147 is electrically connected to the conductive shielding layer 116, and the other exposed second interconnect structure 147 is electrically connected to the CMOS wafer 110. The exposed second interconnect structure 147 that is not electrically connected to the conductive shielding layer 116 can be used to perform wire bonding, and thus the formation of the CMOS-MEMS-device-including package is finished.

Since at least one exposed second interconnect structure 147 is electrically connected to the conductive shielding layer 116, when performing the grinding process or etching process to the cap wafer 160, the conductive shielding layer 116 can protect the BEOL elements 114 and the FEOL elements 102 from the electromigration damage.

Furthermore, the MEMS wafer 140 covers the BEOL elements 114 and the FEOL elements 102. In other words, an orthogonal projection of the MEMS wafer 140 on the CMOS wafer 110 overlaps with the BEOL elements 114 and the FEOL elements 102. In some embodiments, when performing the grinding process, e.g. a chemical mechanical polishing (CMP) process, on the residue portion 160' of the cap wafer 160 to form the opening 161, some fine particles may be sputtered along a direction that faces the BEOL elements 114 and the FEOL elements 102. Since the MEMS wafer 140 covers the BEOL elements 114 and the FEOL elements 102, the MEMS wafer 140 can protect the BEOL elements 114 and the FEOL elements 102 from the fine particles caused by the grinding process.

Figure 9:
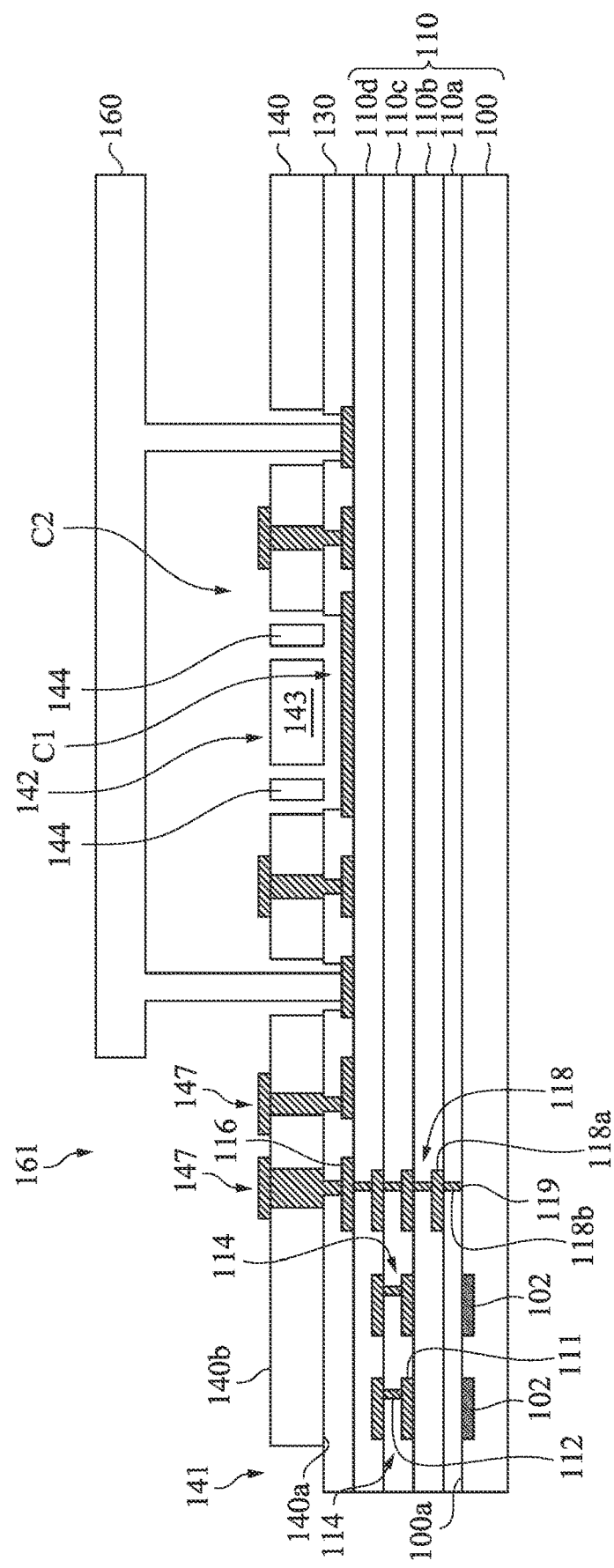
FIG. 9 is a cross-sectional view of a CMOS-MEMS device in accordance with a various embodiments of the present disclosure.

FIG. 9 is a cross-sectional view of a CMOS-MEMS device in accordance with various embodiments of the present disclosure. The difference between FIG. 9 and FIG. 8 is that the conductive shielding layer 116 in FIG. 9 does not cover the BEOL elements 114 and the FEOL elements 102. In other words, the orthogonal projection of the conductive shielding layer 116 on the semiconductor substrate 100 is separated from the orthogonal projections of the BEOL elements 114 and the FEOL elements 102 on the semiconductor substrate 100. In some embodiments, at least one of the openings 141 of the MEMS wafer 140 may not overlap with the BEOL elements 114 and the FEOL elements 102. For example, in the embodiment of FIG. 9, the leftmost opening 141 of the MEMS wafer 140 does not overlap with the BEOL elements 114 and the FEOL elements 102. As a result, when performing the etching process (for patterning the MEMS wafer 140 and thus forming openings 141) on the MEMS wafer 140, the leftmost opening 141 of the MEMS wafer 140 does not cause damages to the BEOL elements 114 and the FEOL elements 102. Therefore, in some embodiments, the conductive shielding layer 116 may no need to cover the BEOL elements 114 and the FEOL elements 102 if the openings 141 of the MEMS wafer 140 do not overlap with the BEOL elements 114 and the FEOL elements 102.

In FIG. 9, the MEMS wafer 140 covers the BEOL elements 114 and the FEOL elements 102. In other words, an orthogonal projection of the MEMS wafer 140 on the semiconductor substrate 100 overlaps with an orthogonal projection of the BEOL elements 114 and the FEOL elements 102 on the semiconductor substrate 100. One of the second interconnect structures 147 formed in the MEMS wafer 140 exposed by the opening 161 of the cap wafer 160 is electrically connected to the conductive shielding layer 160. As a result, when performing other MEMS related processes, e.g. a grinding process or an etching process, on the cap wafer 160, the charges accumulated or received from the second surface 140b of the MEMS wafer 140 can be conducted to the semiconductor substrate 100 through the second interconnect structures 147, the conductive shielding layer 146 and the first interconnect structure 118. Furthermore, in some embodiments, when performing the grinding process on the residue portion 160' of the cap wafer 160, the MEMS wafer 140 can protect the BEOL elements 114 and the FEOL elements 102 from the fine particles caused by the grinding process.

Figure 10:
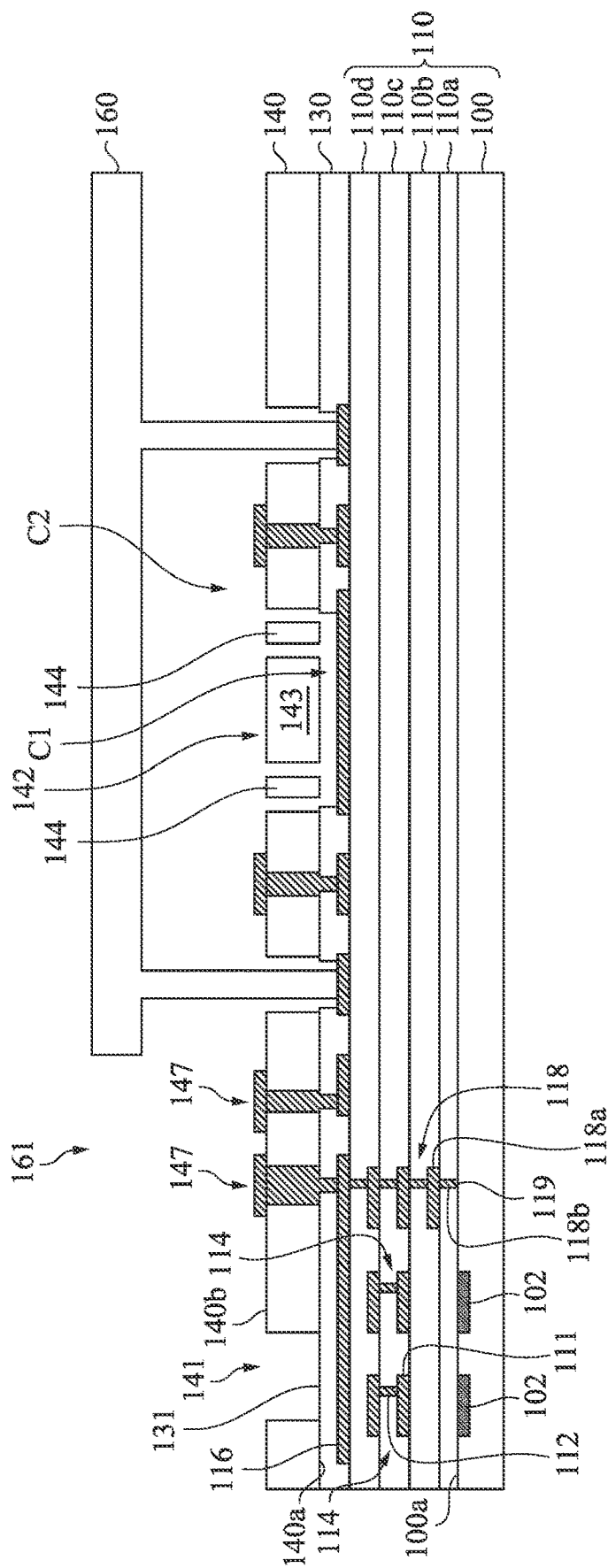
FIG. 10 is a cross-sectional view of a CMOS-MEMS device in accordance with various embodiments of the present disclosure.

FIG. 10 is a cross-sectional view of a CMOS-MEMS device in accordance with various embodiments of the present disclosure. The difference between FIG. 10 and FIG. 9 is that the leftmost opening 141 of the MEMS wafer 140 in FIG. 10 overlaps with at least one of the BEOL elements 114 and the FEOL elements 102. More specifically, an orthogonal projection of the leftmost opening 141 on the CMOS wafer 110 overlaps with at least one of the BEOL elements 114 and the FEOL elements 102. Furthermore, the conductive shielding layer 116 in FIG. 10 covers the BEOL elements 114 and the FEOL elements 102. Since the conductive shielding layer 160 covers the BEOL elements 114 and the FEOL elements 102, and the conductive shielding layer 160 is electrically connected to the semiconductor substrate 100, the charges accumulated or received from the second surface 140b of the MEMS wafer 140 or from the surface 131 of the ILD layer 130 can be conducted to the semiconductor substrate 100 through the conductive shielding layer 146. As a result, the BEOL elements 114 and the FEOL elements 102 can be protected from the electromigration damage.

In some embodiments, since the leftmost opening 141 of the MEMS wafer 140 in FIG. 10 overlaps with the BEOL elements 114 and the FEOL elements 102, when performing the etching process (for patterning the MEMS wafer 140 and thus forming openings 141) on the MEMS wafer 140, the BEOL elements 114 and the FEOL elements 102 may be damaged through the leftmost opening 141 of the MEMS wafer 140. As a result, the conductive shielding layer 116 in FIG. 10 needs to cover the BEOL elements 114 and the FEOL elements 102. More specifically, an orthogonal projection of the conductive shielding layer 116 on the semiconductor substrate 100 overlaps with an orthogonal projection of the leftmost opening 141 on the semiconductor substrate 100, thereby protecting the BEOL elements 114 and the FEOL elements 102 from the etching process of forming the leftmost opening 141 in FIG. 10.

Figure 11:
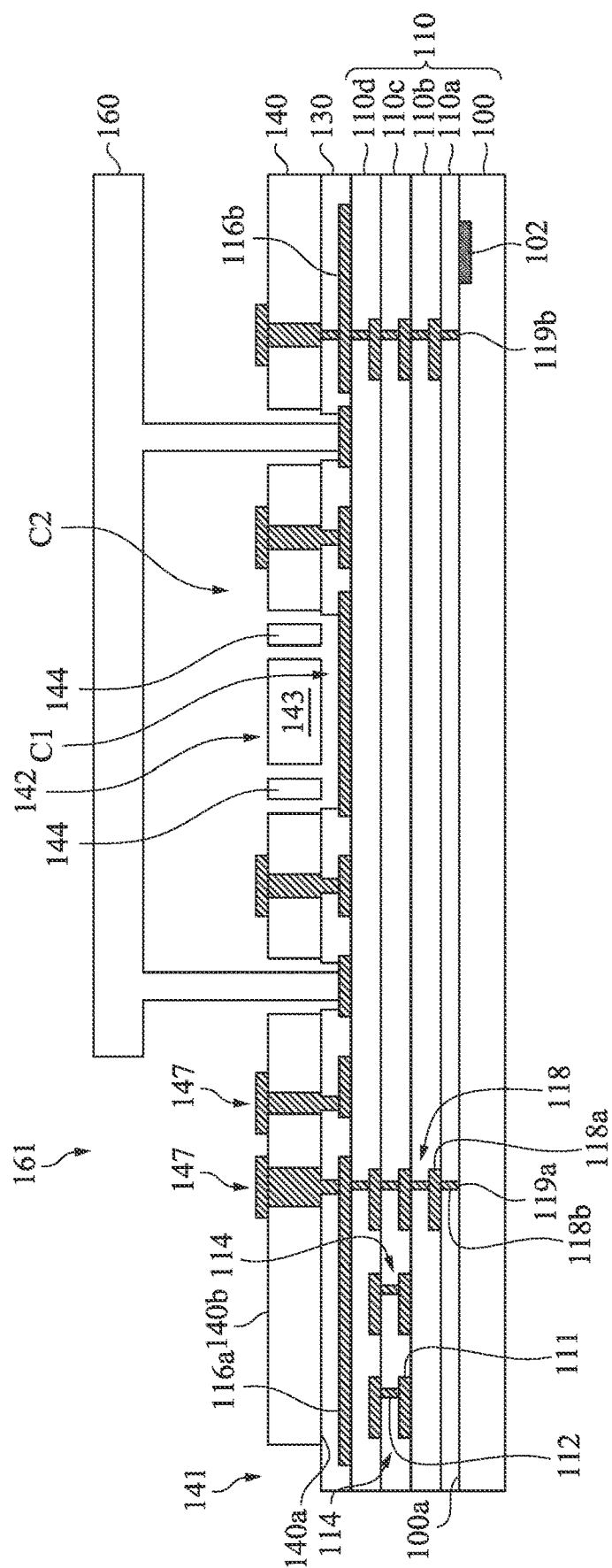
FIG. 11 is a cross-sectional view of a CMOS-MEMS device in accordance with various embodiments of the present disclosure.

FIG. 11 is a cross-sectional view of a CMOS-MEMS device in accordance with various embodiments of the present disclosure. The difference between FIG. 11 and FIG. 8 is that there are two conductive shielding layers 116a, 116b, and the conductive shielding layers 116a, 116b are electrically connected to the ground contacts 119a, 119b, respectively. The ground contacts 119a, 119b are contact portions on the surface 100a of the semiconductor substrate 100. In various embodiments, the ground contacts 119a, 119b are contact portions that are grounded.

The conductive shielding layer 116a covers the BEOL elements 114, and the conductive shielding layer 116b covers the FEOL elements 102. More specifically, in the embodiment of FIG. 11, an orthogonal projection of the conductive shielding layer 116a on the semiconductor substrate 100 overlaps with an orthogonal projection of the BEOL elements 114 on the semiconductor substrate 100, and an orthogonal projection of the conductive shielding layer 116b on the semiconductor substrate 100 overlaps with an orthogonal projection of the FEOL elements 102 on the semiconductor substrate 100. Since the BEOL elements 114 and the FEOL elements 102 are covered by the conductive shielding layers 116a, 116b, separately. The BEOL elements 114 and the FEOL elements 102 can be protected from the MEMS related process damages.

Figure 12:
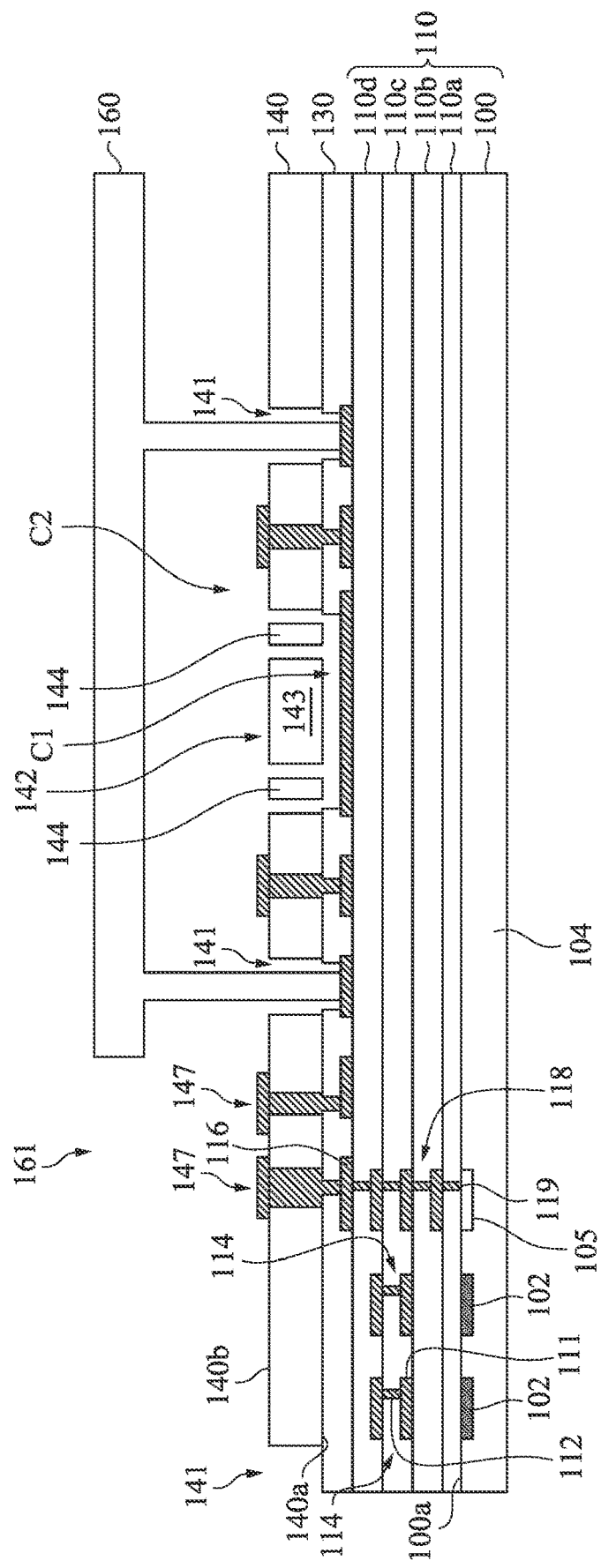
FIG. 12 is a cross-sectional view of a CMOS-MEMS device in accordance with various embodiments of the present disclosure.

FIG. 12 is a cross-sectional view of a CMOS-MEMS device in accordance with various embodiments of the present disclosure. The difference between FIG. 12 and FIG. 8 is that the semiconductor substrate 100 of FIG. 12 includes a first dopant implant region 104 and a second dopant implant region 105, in which the second dopant implant region 105 has a higher dopant concentration than the first dopant implant region 104. In some embodiments, the first dopant implant region 104 has the same conductivity type as the second dopant implant region 105. For example, the first dopant implant region 104 and the second dopant implant region 105 may be implanted with N-type dopants or P-type dopants. The conductive shielding layer 116 is electrically connected to the second dopant implant region 105 through the ground contact 119. More specifically, in some embodiments, the ground contact 119 is a contact portion on the surface 100a of the semiconductor substrate 100 that is electrically connected to the second dopant implant region 10. Since the second dopant implant region 105 has a higher dopant concentration than the first dopant implant region 104, the charges (such as electrons) can be conducted into the semiconductor substrate 100 and thus grounded. Therefore, the risk of the electromigration damage to the FEOL elements 102 and the BEOL elements 114 decreases.

In the embodiments, by forming a conductive shielding layer in the dielectric layers of the CMOS wafer, and electrically connecting the conductive shielding layer to a ground contact, the charges, plasma and electric arc can be shielded from the FEOL elements and the BEOL elements during the MEMS related process, e. g. etching process, grinding process, CMP process, etc. Accordingly, the electromigration damage to the FEOL elements 102 and the BEOL elements 114 can be avoided. In addition, in some embodiments, since the MEMS wafer or the conductive shielding layer covers the BEOL elements and the FEOL elements, when performing the grinding process on the residue portion of the cap wafer, the MEMS wafer can protect the BEOL elements and the FEOL elements from the fine particles caused by the grinding process, such that the yield in fabricating the CMOS-MEMS device can increase.

According to various embodiments of the present disclosure, a method includes forming a front-end-of-the-line (FEOL) element over a substrate; forming a back-end-of-the-line (BEOL) element over the FEOL element; forming an interconnection structure over the substrate; forming a conductive shielding layer electrically connected to the interconnection structure and vertically overlapping the FEOL element and the BEOL element, wherein the conductive shielding layer is grounded to the substrate through the interconnection structure; and forming a dielectric layer covering the conductive shielding layer.

According to various embodiments of the present disclosure, a method includes forming a front-end-of-the-line (FEOL) element over a substrate; forming a back-end-of-the-line (BEOL) element over the FEOL element; forming a first interconnection structure over the substrate; forming a dielectric layer covering the first interconnection structure; and forming a micro electromechanical system (MEMS) wafer over the dielectric layer and vertically overlapping the FEOL element and the BEOL element, wherein the MEMS wafer is grounded to the substrate through the first interconnection structure.

According to various embodiments of the present disclosure, a method includes forming a front-end-of-the-line (FEOL) element over a substrate; forming a back-end-of-the-line (BEOL) element over the FEOL element; forming an interconnection structure over the substrate; forming a conductive shielding layer electrically connected to the interconnection structure; and forming a micro electromechanical system (MEMS) wafer having a MEMS device over the conductive shielding layer, wherein the conductive shielding layer and the MEMS wafer are grounded to the substrate through the interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a front-end-of-the-line (FEOL) element over a substrate, wherein the substrate comprises a first implantation region and a second implantation region within the first implantation region, the second implantation region has a same type dopant as the first implantation region, and has a higher dopant concentration than the first implantation region;
    forming a back-end-of-the-line (BEOL) element over the FEOL element;
    forming an interconnection structure over the substrate;
    forming a conductive shielding layer in contact with the interconnection structure and vertically overlapping the FEOL element and the BEOL element, wherein the conductive shielding layer is grounded to the second implantation region of the substrate through the interconnection structure; and
    forming a dielectric layer covering the conductive shielding layer.

2. The method of claim 1, wherein the conductive shielding layer vertically overlaps the interconnection structure.

3. The method of claim 1, further comprising:
    bonding a cap wafer to the substrate and covering the conductive shielding layer; and
    removing a portion of the cap wafer that is vertically above the conductive shielding layer.

4. The method of claim 1, further comprising forming a micro electromechanical system (MEMS) wafer over the FEOL element and the BEOL element, wherein the MEMS wafer is grounded to the second implantation region of the substrate through the interconnection structure.

5. A method, comprising:
    forming a front-end-of-the-line (FEOL) element over a substrate having a first implantation region;
    forming a back-end-of-the-line (BEOL) element over the FEOL element;
    forming a first interconnection structure over the substrate;
    forming a dielectric layer covering the first interconnection structure; and
    forming a micro electromechanical system (MEMS) wafer over the dielectric layer and vertically overlapping the FEOL element and the BEOL element, wherein the MEMS wafer is grounded to a second implantation region of the substrate within the first implantation region of the substrate through the first interconnection structure, and wherein the second implantation region has a same type dopant as the first implantation region, and has a higher dopant concentration than the first implantation region.

6. The method of claim 5, further comprising forming a MEMS device in the MEMS wafer, wherein the MEMS device comprises a movable element.

7. The method of claim 6, further comprising patterning the dielectric layer to form a cavity, wherein the movable element of the MEMS device is aligned with the cavity.

8. The method of claim 5, further comprising forming a second interconnection structure in the MEMS wafer, wherein the second interconnection structure is electrically connected to the first interconnection structure.

9. The method of claim 8, further comprising forming a conductive shielding layer over the first interconnection structure, wherein the conductive shielding layer electrically connected the second interconnection structure to the first interconnection structure.

10. The method of claim 5, further comprising forming a conductive shielding layer over the first interconnection structure, wherein the conductive shielding layer vertically overlaps the FEOL element and the BEOL element.

11. The method of claim 10, wherein the conductive shielding layer is grounded to the substrate through the first interconnection structure.

12. The method of claim 5, further comprising:
    etching the MEMS wafer to form openings; and
    bonding a cap wafer to the substrate through the openings of the MEMS wafer.

13. The method of claim 12, further comprising removing a portion of the cap wafer that is vertically above the FEOL element and the BEOL element.

14. A method, comprising:
    forming a front-end-of-the-line (FEOL) element over a substrate;
    forming a back-end-of-the-line (BEOL) element over the FEOL element;
    forming an interconnection structure over the substrate;

forming a conductive shielding layer electrically connected to the interconnection structure; and forming a micro electromechanical system (MEMS) wafer having a MEMS device over the conductive shielding layer, wherein the MEMS wafer is a silicon wafer and is electrically connected to the conductive shielding layer through a conductive material in the MEMS wafer, and wherein the conductive shielding layer and the MEMS wafer are grounded to the substrate through the interconnection structure.

15. The method of claim 14, wherein the conductive shielding layer vertically overlaps the FEOL element and the BEOL element.

16. The method of claim 14, wherein forming the conductive shielding layer further comprises forming metal lines, and the method further comprising:

forming a dielectric layer over the conductive shielding layer;

patterning the dielectric layer to expose the metal lines;

etching the MEMS wafer to form openings that expose the metal lines; and bonding a cap wafer to the substrate through the openings.

17. The method of claim 14, further comprising:

forming a dielectric layer over the conductive shielding layer; and patterning the dielectric layer to form a first cavity, wherein the MEMS device is exposed to the first cavity.

18. The method of claim 17, further comprising forming a cap wafer over the MEMS wafer, such that a second cavity is formed between the cap wafer and the MEMS wafer, wherein the MEMS device is exposed to the second cavity.

19. The method of claim 16, further comprising removing a portion of the cap wafer that vertically overlaps the conductive shielding layer.

20. The method of claim 14, wherein the conductive material in the MEMS wafer is in contact with the conductive shielding layer.

* * * * *